METHOD OF FABRICATING SEMICONDUCTOR DEVICES BY DIFFUSION
Filed Sept. 9, 1968
STEP 1
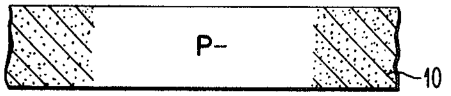
STEP 2
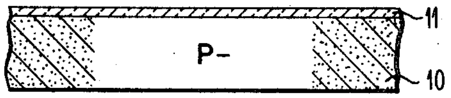
STEP 3
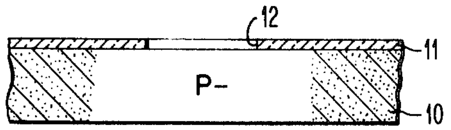
STEP 4
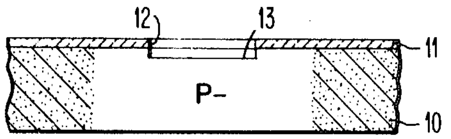
STEP 5
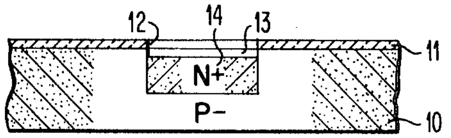
STEP 6
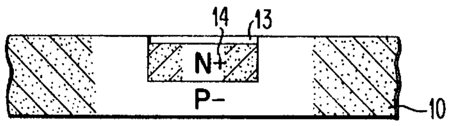
STEP 7
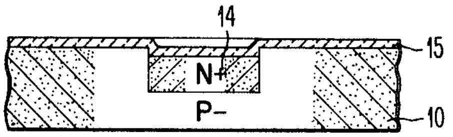
STEP 8
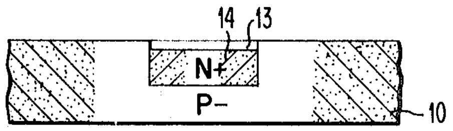
STEP 9
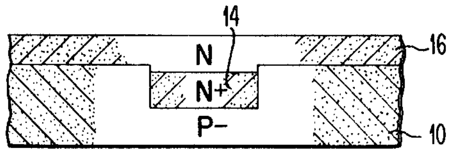
INVENTORS
VEN Y. DOO
ANDREA SPIRO
BY J. B. Kraft
ATTORNEY 3,600,241

METHOD OF FABRICATING SEMICONDUCTOR DEVICES BY DIFFUSION

Ven Y. Doo, Poughkeepsie, and Andrea Spiro, Pleasant Valley, N.Y., assignors to International Business Machines Corporation, Armonk, N.Y.

Filed Sept. 9, 1968, Ser. No. 758,236
Int. Cl. H01l 7/00, 7/36; C23c 11/00
U.S. Cl. 148—175 5 Claims

ABSTRACT OF THE DISCLOSURE

In semiconductor device fabrication, after diffusion has been carried out at elevated temperatures through a $SiO_2$ or other diffusion barrier masks, the mask is stripped from the surface of the semiconductor substrate, and the surface of the semiconductor substrate is reoxidized. This eliminates surface defects in the semiconductor substrate which tend to arise at the elevated temperatures over relatively long periods of time necessary for diffusion. Where an epitaxial layer is to be formed on the surface of the substrate, the oxide layer is first removed from the surface. This reduces stacking faults in the epitaxial layer caused by the surface irregularities in the substrate.

BACKGROUND OF THE INVENTION

Field of the invention

The present invention relates to microelectronic semiconductor devices, and particularly to methods of fabricating such devices by diffusion of conductivity-determining impurities.

Description of the prior art

The operation of semiconductor devices is dependent upon the presence of selected carriers in selected regions of the semiconductor structure. By "carriers" is meant the free-holes or electrons which are responsible for the passage of current through a semiconductor material. Majority carriers are used in reference to those carriers which are prevalent and determine conductivity characteristics in a given region of semiconductor material, i.e., holes in P type material or electrons in N type material. By the use of the term "minority carriers," it is intended to signify those carriers in the minority, i.e., holes in N type material or electrons in P type material. N type regions or P type regions are generally formed by the diffusion of conductivity-determining impurities into selected regions of the semiconductor substrate. The conductivity-determining impurities which produce a majority of free-holes in a given region is known as a P type impurity and produces a P type region. On the other hand, an impurity which results in a majority of electrons in a given region is known as an N type material and the region as an N type region. A conventional manner of incorporating conductivity-determining impurities into a semiconductor substrate is to form a diffusion barrier mask of a material such as silicon dioxide, silicon nitride or aluminum oxide on the semiconductor substrate having openings corresponding to the regions into which conductivity-determining impurity is to be diffused. Then, the conductivity-determining impurities are diffused from either the gaseous or solid state through the openings in the mask into the semiconductor substrate. After a given diffusion step, it is conventional practice to cover the openings with the barrier mask material, e.g., in the case of an $SiO_2$ mask, by reoxidizing the exposed silicon in the mask openings. Then, additional holds may be opened in the barrier layer for subsequent diffusions or the layer may be removed and an epitaxial layer grown on the semiconductor surface. The last technique is utilized in forming buried regions of a selected conductivity type in a semiconductor structure.

In processes wherein epitaxial layers are grown on a substrate previously subjected to diffusion, undesirable stacking faults arise throughout the epitaxial layer. Such stacking faults produce non-uniformities in the epitaxial layer, resulting in the tendency towards short-circuiting in the devices being fabricated, undesirable resistivity characteristics, as well as irregularities in the surface of the epitaxial layer, which tend to interfere with subsequent processing steps such as masking.

SUMMARY OF THE INVENTION

Accordingly, it is an object of this invention to provide a method of conductivity-determining impurity diffusion which has no undesirable effects on subsequent processing steps.

It is a further object of this invention to provide a method of diffusion which has no effects on subsequently formed epitaxial layers.

It is still another object of this invention to provide a method for forming epitaxial layer free of stacking faults on a previously diffused semiconductor substrate.

It is an even further object of this invention to provide a method of diffusion which minimizes attendant surface defects on the semiconductor substrate.

It is yet a further object of this invention to provide a method for eliminating defects in semiconductor substrate surface resulting from diffusion steps.

It is even a further object of this invention to provide a method of fabricating a semiconductor device having a buried region.

It is yet another object of this invention to provide a method of fabricating a semiconductor structure having an epitaxial layer with a minimum of stacking faults on a previously diffused semiconductor substrate having optically discernible indicia to be utilized in obtaining registration during subsequent processing.

We have found that stacking faults in the epitaxial layer arise because of surface irregularities and defects in the semiconductor substrate. Such defects are a result of the diffusion processing which is conventionally carried out at temperatures in excess of 1,000° C. for periods of up to several hours. In accordance with our invention, after the diffusion is completed, the diffusion barrier mask is completely removed, and the semiconductor substrate is reoxidized to convert the substrate surface into an oxide such as silicon dioxide. Then, the oxide layer is removed. The remaining surface is essentially free of the surface defects which act as nucleation centers for stacking faults in subsequent epitaxial growth on the surface. Now, an epitaxial layer essentially free of stacking faults may be grown on the semiconductor substrate.

While the advantage of the diffusion process of the present invention is marked with respect to the formation of epitaxial layers, there are advantages in the present process in other aspects of semiconductor fabrication. Surface defects resulting from the diffusion conditions arise at the interface of the substrate and the masking layer such as $SiO_2$. These defects interfere with the functioning of the mask as a passivating layer in devices utilizing the mask as a passivating layer in final structure. The effectiveness of the passivating layer as a barrier against contaminating metallic ions, such as sodium ions, appears to be lessened. On the other hand, effective passivation of the device may be achieved by removing the silicon dioxide mask subsequent to diffusion, and reoxidizing the semiconductor substrate.

The foregoing and other objects, features and advantages of the invention will be apparent from the following more particular description and preferred embodiments of the invention as illustrated in the accompanying drawings.

BRIEF DESCRIPTION OF THE DRAWINGS

The drawing is a flow diagram, in cross-sectional form, depicting the steps involved in carrying out the diffusion and subsequent epitaxial deposition steps in accordance with one embodiment of the present invention.

DESCRIPTION OF THE PREFERRED EMBODIMENTS

A wafer of P-type conductivity, preferably having a resistivity of 10 to 20 ohm-cm. and a thickness of about 8 mils, is used as the starting substrate 10 shown in step 1. The wafer is preferably a monocrystalline silicon structure which can be fabricated by conventional techniques such as pulling a silicon semiconductor member from a melt containing the desired impurity concentration and then slicing the pulled member into a plurality of wafers. The wafers are cut, lapped and chemically polished to the desired thickness. The wafers are oriented 4° (±0.5°) off the (111) axis towards the (110) direction.

Referring to step 2, an oxide coating 11, preferably of silicon dioxide having a thickness of 5000 A. units, is thermally grown by conventional heating in a dry oxygen atmosphere for 15 minutes at 970° C., followed by heating in a wet or steam atmosphere at 970° C. for 100 minutes, and an additional 5 minutes in a dry atmosphere at said temperature. If desired, the oxide layer can be formed by pyrolitic deposition or by an RF sputtering technique as described in U.S. Pat. No. 3,369,991.

By standard photographic masking and etching techniques, a photo-resist layer is deposited onto the oxide layer and by using the photo-resist layer as a mask, surface regions are exposed on the surface of the wafer by etching away the desired silicon doxide layer with a standard, buffered HF solution. The photo-resist layer is then removed, leaving the structure shown in step 3, in which silicon dioxide layer 11 serves as a mask having opening 12 through which subsequent diffusion into the semiconductor substrate may be carried out.

Then, using a composition which etches silicon, preferentially to silicon dioxide, recess 13 is etched in substrate 10 through hole 12 in mask 11. One composition which may be used to so preferentially etch silicon is an acid etch of the following composition:

| | Parts by volume |
|---|---|
| 5% aqueous $H_2SO_4$ | 8 |
| HF (4.8% aqueous solution) | 3 |
| 10% aqueous $CrO_3$ | 2 |
| Water | 40 |

Then, N+ region 14, shown in step 5, is formed in substrate 10 by diffusion through mask 11 of N type impurities. The diffusion operation is carried out in an evacuated quartz capsule using degenerate arsenic-doped silicon powder at a temperature of 1108° C. for a period of 16 hours. The resulting N+ region has a sheet resistance of 10 ohms/square.

Then, using a concentrated HF solution, silicon dioxide mask 11 is removed, leaving the structure shown in step 6. in which the substrate 10 has a recess 13 in the surface of the N+ region 14.

Next, the wafer surface is reoxidized by the previously described oxidation cycle to form a new oxide layer 15 having a thickness of 5000 A. units, as shown in step 7. Preferably, the oxide layer should have a thickness of at least 4500 A.

Layer 15 is removed using a concentrated HF solution to leave the structure shown in step 8. This structure is relatively free of any surface defects which may have existed in the structure shown in step 6 as a result of the diffusion step. Recess 13 in this structure is utilizable as as a visual or optically discernible indicator of the limits of N+ region 14. In many of the potential subsequent processing steps in this device fabrication, an indication of the limits of region 14 is necessary for mask alignment. Then, as shown in step 9, an epitaxial layer of N type conductivity, preferably having a resistivity of about 0.1 ohm-cm., is epitaxially grown on the surface of substrate 10 by conventional techniques at a temperature of about 1210° C. The epitaxial region contains arsenic as its impurity and it has a thickness of approximately 5 microns. Thus, region 14 is a buried layer which may be utilized in combination with selected conductivity zones in the epitaxial layer 16 to provide semiconductor devices of particular types. For example, if a subsequent base and emitter diffusion is made in the epitaxial layer above region 14, the buried region 14 will act as a buried subcollector. Recess 13 will act as an indicator for mask alignment so that the base and emitter regions to be formed are in the selected spacial relationship to buried region 14.

Another aspect of the present invention is based upon the recognition that as a result of elevated temperature diffusions, surface irregularities arise on the substrate not only in the areas subject to diffusion as a result of the stress created in the diffusion region, but also in the areas of the surface beneath the diffusion barrier mask. In order that the defects in the surface beneath the barrier mask be eliminated, it is necessary that the barrier mask be first removed. Then, the entire surface is preferably oxidized. This oxidation converts the surface areas containing the irregularities to an oxide which may subsequently be removed. With substrates of certain semiconductor material such as germanium or gallium arsenide which are not readily oxidizable, other methods for removing the surface layer may be utilized. Chemical methods such as etching and electrochemical etching may be used for removing the impurity-containing surface areas. Preferably, a layer having a thickness of at least 2000 A. is etched away from the surface.

For example, the following composition may be used to etch away a germanium surface:

| | Parts by volume |
|---|---|
| 70% $HNO_3$ | 5 |
| 48% HF | 2 |
| $H_2O$ | 7 to 14 |

After mask removal, the semiconductor substrate may also be cleared of defects by a combination of etching and reoxidation. For example, a silicon substrate surface from which a silicon dioxide mask has been removed after diffusion may then be etched to remove a small increment in the order of 1000 A. in thickness. Then, a substrate is reoxidized in the above-mentioned manner to form an oxide layer approximately 4000 A. in thickness. This oxide layer is then removed prior to epitaxial deposition.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming a buried region in semiconductor device fabrication comprising:

forming a diffusion barrier mask on a surface of a silicon substrate;

diffusing conductivity-determining impurities through an opening in the mask into the substrate at elevated temperatures to form a region of selected conductivity;

removing the mask;

thermally oxidizing the surface to form a layer of silicon oxide at said surface;

removing the oxide layer; and epitaxially growing a silicon layer on said surface.

2. The method of claim 1 wherein the exposed surface area of the substrate corresponding to the mask opening is selectively removed to form a recess corresponding to the buried region.

3. The method of claim 1 wherein said thermal oxide layer is at least 4500 A. thick.

4. A method of forming a buried region in semiconductor device fabrication comprising:

forming on the surface of a silicon substrate a diffusion barrier mask having an opening corresponding to the buried region;

etching through said mask, with an etchant that selectively attacks the silicon substrate, a recess in said surface corresponding to said opening;

diffusing conductivity-determining impurities through the opening in said mask into said substrate at elevated temperatures to form a region of selected conductivity corresponding to said recess;

removing the mask;

thermally oxidizing the surface to form a layer of silicon oxide at said surface;

removing the oxide layer; and epitaxially growing a silicon layer on said surface.

5. The method of claim 4 wherein said silicon substrate is of a first conductivity type and said diffused region is of an opposite conductivity type.

References Cited

UNITED STATES PATENTS

| | | | |
|---|---|---|---|
| 2,948,642 | 8/1960 | MacDonald | 148—1.5 |
| 3,243,323 | 3/1966 | Corrigan et al. | 148—175 |
| 3,281,915 | 11/1966 | Schramm | 148—1.5X |
| 3,345,222 | 10/1967 | Nomura et al. | 148—175 |
| 3,379,584 | 4/1968 | Bean et al. | 148—175 |
| 3,398,029 | 8/1968 | Yasufuku et al. | 148—187 |
| 3,494,809 | 2/1970 | Ross | 148—175 |

OTHER REFERENCES

Keonjian, E.: "Microelectronics," Text, copyright 1963, McGraw-Hill, pp. 266–269 and 338–345.

Holland, L.: "Thin Film Microelectronics," Text, copyright 1965, by L. Holland, publ. Chapman & Hall, pp. 96–97.

L. DEWAYNE RUTLEDGE, Primary Examiner

W. G. SABA, Assistant Examiner

U.S. Cl. X.R.

117—106, 107.2, 212; 148—174, 187; 156—17; 317—234